United States Patent
Lee

(10) Patent No.: US 6,583,817 B1
(45) Date of Patent: Jun. 24, 2003

(54) AUTOCALIBRATION OF THE A/D CONVERTER WITHIN THE CMOS TYPE IMAGE SENSOR

(75) Inventor: Sywe N. Lee, Taipei (TW)

(73) Assignee: Taiwan Advanced Sensors Corp., Taipei (TW)

( * ) Notice: Subject to any disclaimer, the term of this patent is extended or adjusted under 35 U.S.C. 154(b) by 0 days.

(21) Appl. No.: 09/103,959

(22) Filed: Jun. 24, 1998

(51) Int. Cl.$^7$ ................................................ H04N 5/217
(52) U.S. Cl. ......................................... 348/241; 348/572
(58) Field of Search ................................ 348/572, 241, 348/243

(56) References Cited

U.S. PATENT DOCUMENTS

| | | | | |
|---|---|---|---|---|
| 5,877,715 A | * | 3/1999 | Gowda et al. | 348/294 |
| 5,949,483 A | * | 9/1999 | Fossum et al. | 348/303 |
| 6,115,066 A | * | 9/2000 | Gowda et al. | 348/241 |

* cited by examiner

Primary Examiner—Wendy R. Garber
Assistant Examiner—Jason Whipkey
(74) Attorney, Agent, or Firm—Fulbright & Jaworski L.L.P.

(57) ABSTRACT

A method for initializing a counter within a corresponding set of A/D converters of N sets of A/D converters of a single-chip CMOS-type image sensor in order to minimize none uniformity across the N sets of A/D converters is provided. The single chip CMOS type image sensor includes an image sense array having N columns of output lines for outputting N analog signals respectively; and a signal process device for generating N sets of digital signal each of which corresponds to one of N analog signals respectively. The signal process device has N input lines and N sets of A/D converter each of which including a counter for generating one of the N sets of digital signal respectively. The method comprises the steps of applying a predetermined reference voltage at each of N input lines of the signal process device such that a compensation value corresponding to each set of A/D converter is obtained. The method further preloads the counter of each corresponding set of A/D converter with the compensation value corresponding to each set of A/D converter.

40 Claims, 13 Drawing Sheets

AUTOCALIBRATION OF THE A/D CONVERTER WITHIN THE CMOS TYPE IMAGE SENSOR

FIELD OF INVENTION

The present invention relates to a CMOS type image sensor and, in particular, to an initialization procedure of the A/D within the CMOS type image sensor.

BACKGROUND OF INVENTION

An image sensor is used to transform an optical image focused on the sensor into an electrical signal. The image sensor typically contains an array of light-detecting elements, where each element produces a signal in response to the light intensity impinging on that element when an image is focused on the array. These signals may then be used to display a corresponding image on a monitor.

One very well-known type of image sensor is a charge coupled device (CCD). Integrated circuit chips containing a CCD image sensor are expensive due to the specialized process required. The CCD also consumes a relatively large power dissipation because of the clock signals that are required and the high voltage that is usually needed. In contrast to the CCD image sensor, CMOS active pixel sensors (APS) have attracted much attention recently because of monolithic integration of control, drive and signal process circuitry upon a single sensor chip. The advantages of CMOS APS imagers are: (1) low voltage operation and low power consumption, (2) process compatibility with on-chip electronics, and (3) potentially lower cost as compared to the conventional CCD, because of the wide availability of a standard CMOS manufacturing process.

However, it has been discovered by the inventor that, for large area and high density pixel arrays, the analog signal generated by each light detecting element is subject to varying degrees of parasitic effects such as those caused by parasitic capacitance, resistance, dark current leakage, and non-uniformity of device characteristic. These parasitic effects are inherent in semiconductor devices and result in degradation of the signal-to-noise ratio of the image information. Therefore, noise issues pose a major technical challenge which can limit performance of the CMOS APS. These noises include kTC noise, which is associated with the sampling of the image data, 1/f noise, which is associated with the circuits used to amplify the image signal, and fixed pattern noise which is associated with the non-uniformity between columns within the array.

Even for an identical internal signal at the column line, the device variation, leakage current, and/or mismatching among correlated-double sampling (CDS) circuits and the comparators within the A/D converters in the single integrated circuit CMOS sensor chip will generate different digital signal values at the output of each A/D converter. The variations between the performance of comparators of ADCs and CDS circuits corresponding to cells of different columns are even worse as the line pitch between column lines is shrunk. The invention intends to minimize these parasitic effects of A/D converter and CDS circuits.

SUMMARY OF INVENTION

An active pixel image sensor fabricated by a CMOS process is described herein, which includes a two-dimensional pixel array core of photo sensing diodes whose conductivities are related to the magnitude of light impinging upon the photodiodes. The analog signals generated by the photodiodes are buffered through a source follower amplifier, accessed by row transistors and coupled to respective columns in the array. The analog signals at each column line are converted to digital signals by an A/D converter (ADC) connected to each column line. Among other methods, the A/D converter may be formed by a high-gain comparator, an 8-bit binary counter coordinated with a reference ramp signal synchronized with a specific timing sequence. A specific timing sequence is used to allow the A/D converter circuit to implement the A/D conversion within a time frame, so that all the sensing elements in a row will have their respective light level converted into a digital value during this interval. The timing might allow the resulting digital values to be delivered to another unctional block of the chip or off the chip for processing during this time also, or perhaps during another time interval. In a preferred embodiment, however, before the read operation of the first line, the potential of the input nodes of CDS on each column line is set up to be a "reference" voltage and then its value on each column converted to a digital value through an A/D converter. The resulting output digital data contains information regarding non-uniformity and variation due to the device characteristic variations of A/D converters and CDS circuits. The digital data value corresponding to each output line thus obtained is then used to be the initial value of each ADC counter before following actual A/D operation on a row of the pixel array is performed. Thus, major parasitic effects and distortion for the A/D converters and CDS circuits are minimized during subsequent A/D conversions of actual image.

BRIEF DESCRIPTIONS OF APPENDED DRAWINGS

DETAILED DESCRIPTIONS OF THE PREFERRED EMBODIMENTS

Figure 1:
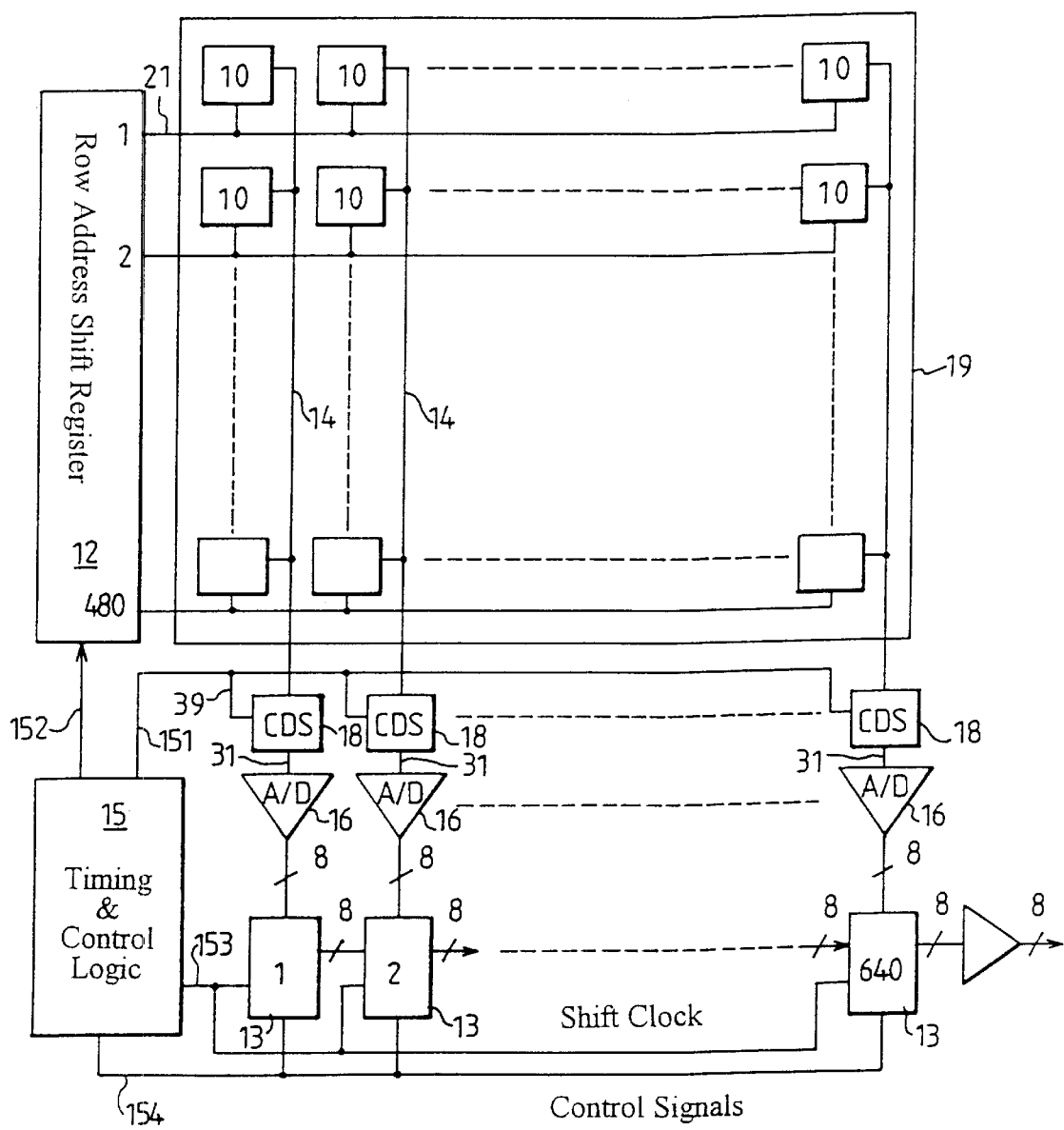
FIG. 1 is a block diagram of a 640×480 CMOS active pixel image sensor in accordance with the prior art.

FIG. 1 illustrates the architecture of a 640×480 CMOS active pixels image sensor formed on a single integrated circuit chip. The image sensor core 19 comprises a two-dimensional pixel array of light detecting elements 10 which include identical circuitry shown in FIG. 2. A row address shift register 12, with its control signals coming from the timing/control logic 15, is connected to the core array 19 to address one row at a time. The output of shift register 12 addresses the core array 19 row-by-row to read the analog signal into the column lines 14 according to a predetermined frame rate timing requirement.

Figure 4:
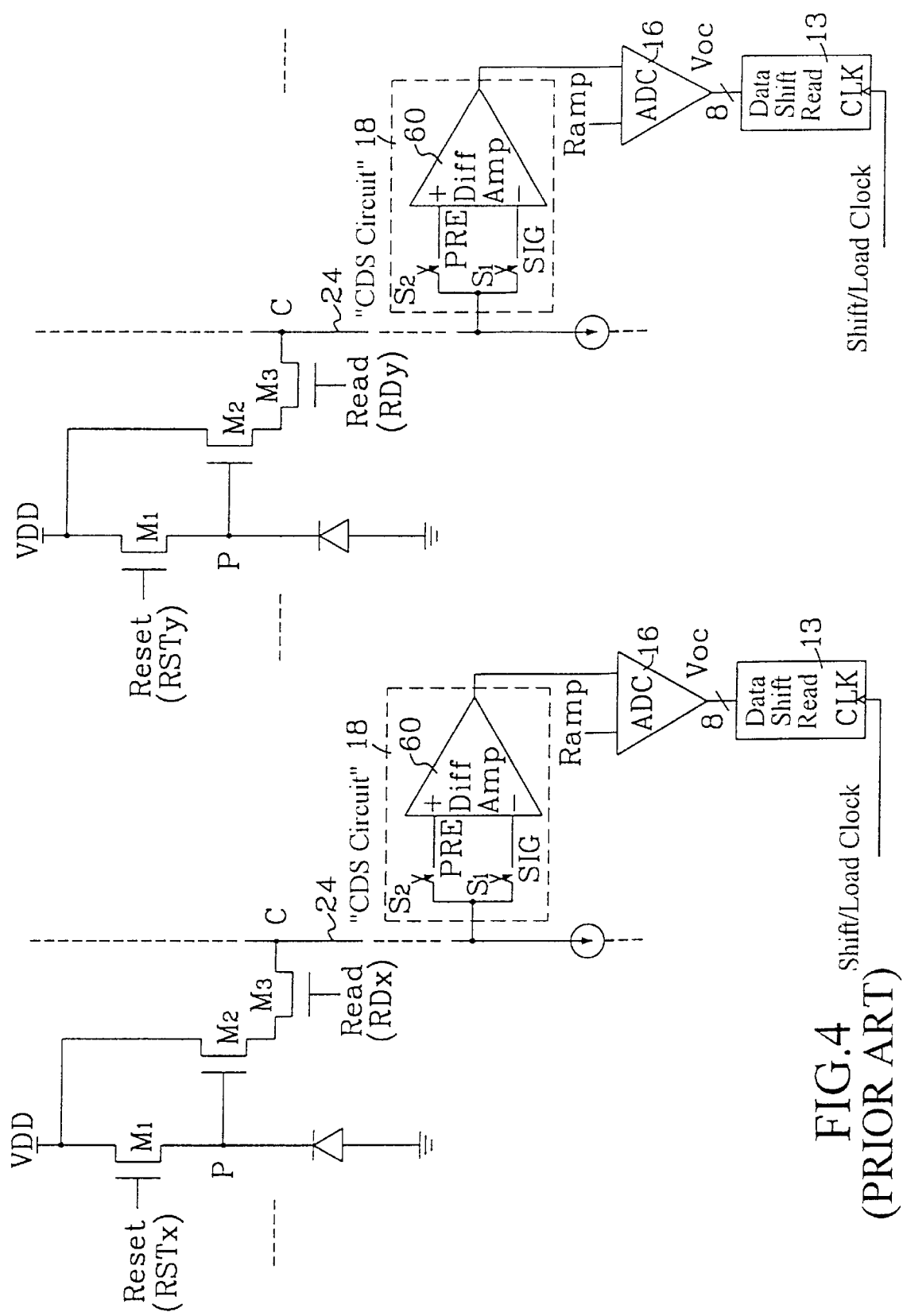
FIG. 4 is a simplified schematic diagram showing the analog signal critical path in accordance with the prior art.

In one embodiment, each A/D converter 16 is connected to receive an analog signal, via a well-known correlated-double sampling (CDS) circuit 18, from corresponding column line 14 and convert each analog signal to a digital signal representative of gray level of light intensity detected by the respective pixel element 10. For example, if an eight-bit A/D conversion is implemented, the analog signal would have 256 values, each representing a level of optical intensity. The function of the CDS circuit 18 will be recited hereinafter when FIG. 4 is touched upon. The timing/control logic 15 outputs timing signals, i.e. switching signals operating the CDS circuit 18, the control signals operating the row address shift register 12, and the signals operating the shift registers 13 to control the operation of the system.

Figure 2:
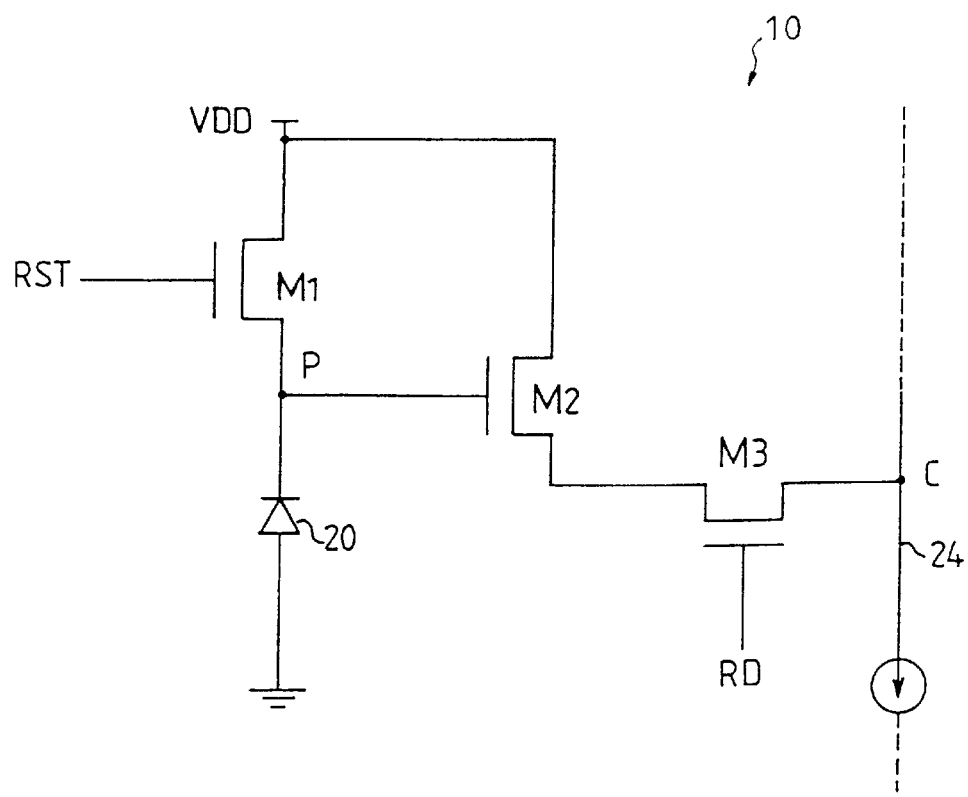
FIG. 2 is a schematic diagram of an active pixel cell and its basic operation timings thereof in accordance with the prior art.
Figure 2:
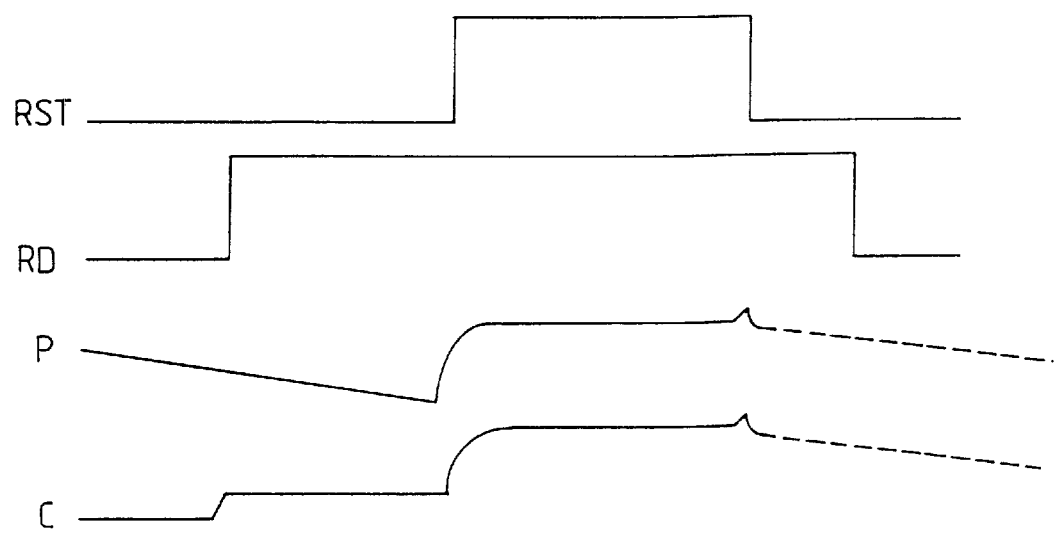

When the sensing operation is being performed, an image is focused on the image sensor core 19 such that a different portion of the image impinges on each pixel element 10. As shown in FIG. 2, each light detecting element 10 comprises a photodiode 20, or an equivalent photo sensing device, such as photogate, bipolar phototransistor, etc. whose conducting current is related to the light intensity impinging upon the junction of photo sensing device.

As illustrated in FIG. 2, at the beginning of the exposure cycle, the internal column line 24 is isolated because the access transistor M3 is off due to the inactive state of the RD signal. The photodiode 20 is initially reset to a value close to VDD level by means of the reset transistor M1 which is turned on by the active state of the signal RST which is output from the row address shift register 12.

Figure 5:
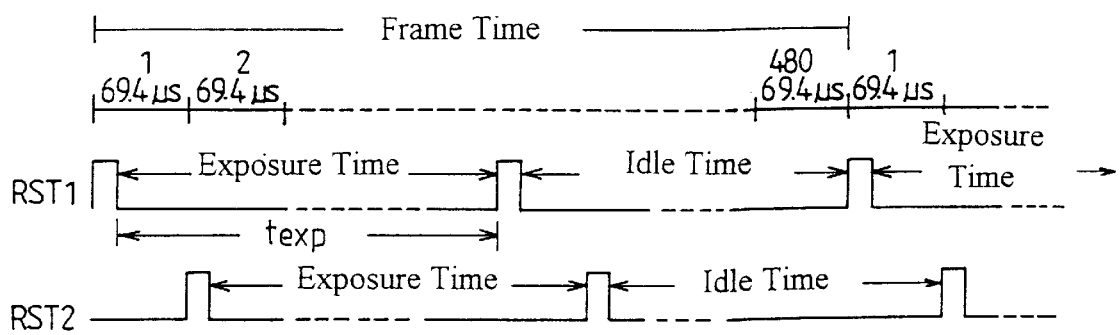
FIG. 5 is the read operating timing diagram for the pixel in the two successive row lines in accordance with the prior art.
Figure 5:
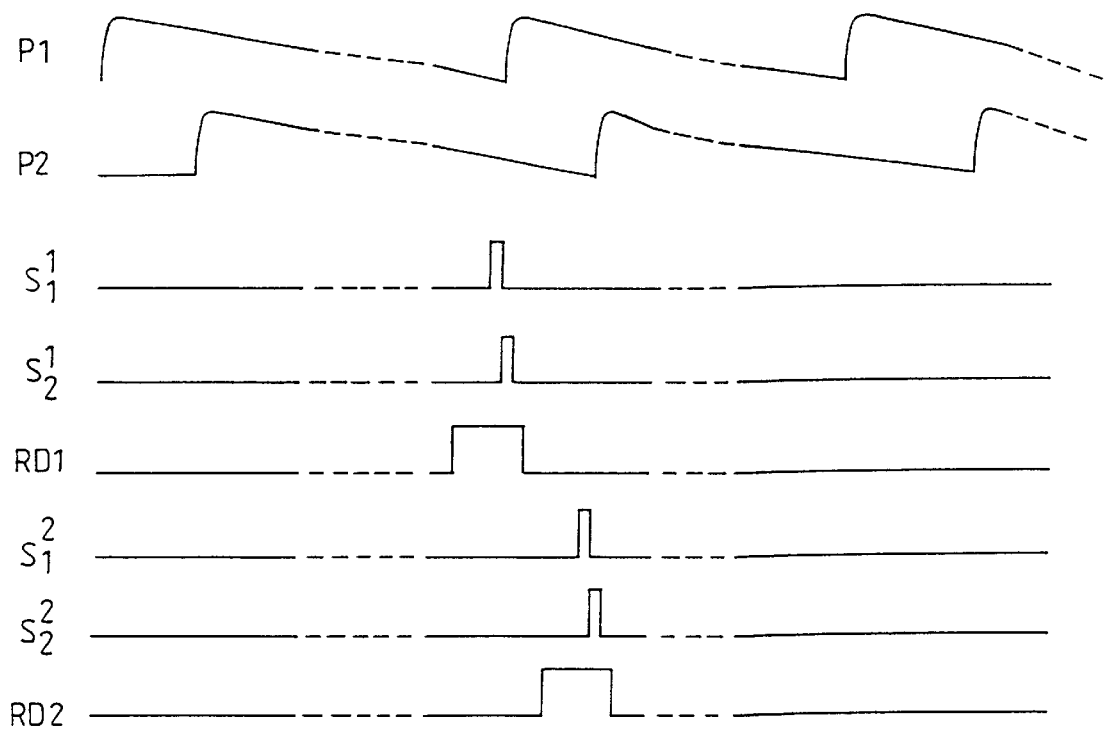

The exposure commences as the reset transistor M1 is turned off by the inactive state of the signal RST. This allows the photodiode current, due to the light impinging on it, to discharge its own inherent capacitance, reducing the charge on node P. The time period, $t_{exp}$ as shown in FIG. 5, which starts at the downward transition of the RST signal and stops at upward transition of the RST signal, is the image exposure time. After a sufficient time from the commencement of the exposure, which may be varied to provide different image sensitivity or exposure control, the access transistors M3 for the row are turned on by an active RD signal. This causes the photodiode voltage at node P, translated through the source follower transistor M2 and the access transistor M3, to be coupled to the internal column line 24. The voltage is-offset by the effects of the source follower transistor M2, and, of course, will vary as the characteristics of the transistor M2. This voltage is stored in a circuitry at the end of the column line 24. At the end of the exposure interval, the reset transistors M1 in the row are then turned on again, causing the input of the source follower M2, which is coupled to the cathode node P of photodiode 20, to be reset to a value close to VDD. The actual signal sensed by the following correlated-double sampling (CDS) circuit is the difference of signals at node C, denoted as ΔVc, before and after the reset signal RST is activated. The subtraction of the signals of the node C at different moments is accomplished by the well known CDS circuitry and the details of which will not be covered by this invention. The signal at column line 24 at different times both contain the offset of the source follower M2 and the access transistor M3, so that error associate thereof is canceled automatically. The difference signal then is presented to the A/D circuit 16 for conversion to a digital value. In other words, the actual image capturing operation is done by capturing the difference of signals at column node C respectively at the end of the exposure time and after the reset signal RST is activated.

Figure 3:
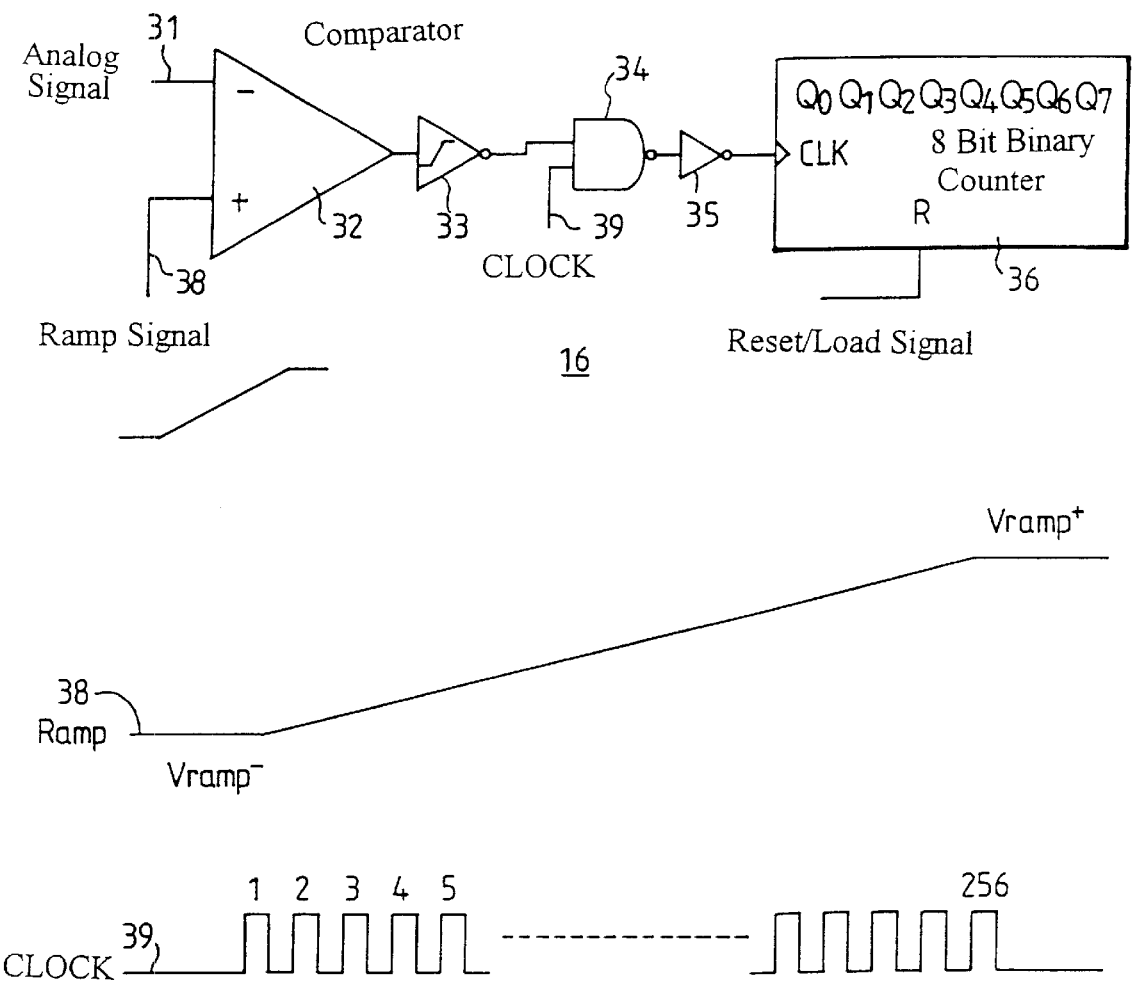
FIG. 3 is a functional block diagram of an 8-bit A/D converter and its reference ramp timing diagram in accordance with the prior art.

FIG. 3 shows a functional block diagram of an exemplary A/D converter 16. The A/D converter 16 illustrated includes a high gain comparator 32, a clock gating logic 34 and an 8-bit binary counter 36, and two inverters 33, 35. However, other arrangements which allow the conversion of the signal to a digital value would also be possible. In the embodiment of FIG. 3, a reference ramp signal 38 is input to the non-inverting input node of the comparator 32, and the analog signal 31 from the CDS circuit is input to the inverting input node of the comparator 32. The clock signal 39 is gated by the output signal of the inverter 33. In performing the A/D conversion, as the reference ramp signal 38 starts to increase and the clock signal 39 starts to tick, the counter 36 starts to count accordingly. When the reference ramp signal 38 is equal to the analog signal 31, the output of comparator 32 flips and un-gates the clock signal 39 via the clock gating logic 34. The output of the counter 36, when it stops counting, therefore represents the digital value corresponding to the analog signal 31. The Vramp− value is the lowest level of the ramp signal 38 and the Vramp+ is the highest level of the ramp signal 38.

As shown in FIG. 4, the critical path of the analog signal from input to output includes the source follower M2, the access transistor M3, the internal column line 24, the CDS circuit 40 and the comparator circuit within the A/D converter 16. Even for an identical analog signal on the node P in different photocells 10, the device variation between the source followers .M2 and between access transistors M3 will generate a different signal value on respective internal column lines 24 of each photocell 10.

These variations can be minimized by aforementioned well known CDS circuitry 40.

The read timings for the pixels in the two successive row lines are exemplarily shown in FIG. 5. The S1 and S2 signals respectively operates the switches S1 and S2 in FIG. 4. As an example, a line time period of 69.4 µs, which corresponds to a 30 Hz frame rate with 480 row lines, is disclosed in FIG. 5 and will be used later when applicable.

However, even for an identical internal signal at each column line, the device variation, leakage current, and/or mismatching among CDS circuits and the comparators within the A/D converters in the single integrated circuit CMOS sensor chip will generate different digital signal values at the output of each A/D converter 16. The variations between the performance of comparators of ADCs and CDS circuits corresponding to cell of different columns are even worse as the line pitch between column lines 24 is shrunk. In order to minimize these parasitic effects of A/D converter 16 and CDS circuits 18, the following preferred embodiment is used.

As shown in the circuit of FIG. 6(*a*) and timings in FIG. 6(*b*), the invention provides a series of the operations for each column in the beginning of the frame time slot and before the read operation for the first line within each frame. In FIG. 6(*b*), the occurrence of the pulses at time t2 and t3 on signals S1, S2 involves the sampling of the actual image signal. The present invention, in addition to two conventional switches S1, S2, provides two additional switches S3, S4, operated by the corresponding signals S3, S4 shown in FIG. 6(*b*), to selectively transmit a difference signal.

At time $t_{1a}$, each internal column line 24 is pulled down to VL by means of the switch S3. This VL volage is then stored in the inverting input node (SIG) of the differential amplifier 60 of the CDS circuit 40 by turning on S1 switch at time $t_{1b}$. At time $t_{1c}$ the switch S4 is turned on causing all of the internal colum lines 24 presetting to VH. It is to be noted that swtich S4 can not be turned on when switch S1 is on. In a preferred embodiment, VH and VL are generally set to be such that the difference of VH and VL, denoted as Vref, is equal to or less than (Vramp+)−(Vramp−)−Vsh, wherein Vramp+ and Vramp− are respectively the highest and lowest level of the ramp signal employed in FIG. 3, and the Vsh is maximum effective volage offset allowable for any given fabrication process in the positive direction, possibly caused by the combination of ADC and CDS circuits for any given column. At time $t_{1d}$, the voltage VH is transferred and stored to the non-inverting input node (PRE) of the differential amplifier 60 of the CDS circuit 18 by turning on the switch S2. As a result, shortly after the time $t_{1d}$ the output of CDS circuit 40 for each column in array would be Vref, which is obtained by subtracting VL on node (SIG) from VH on node (PRE), assuming the offset voltage for each CDS is negligible. It is to be noted that the switch S2 is turned off before M3 is turned on for sampling of actual image signal.

Figure 6A:
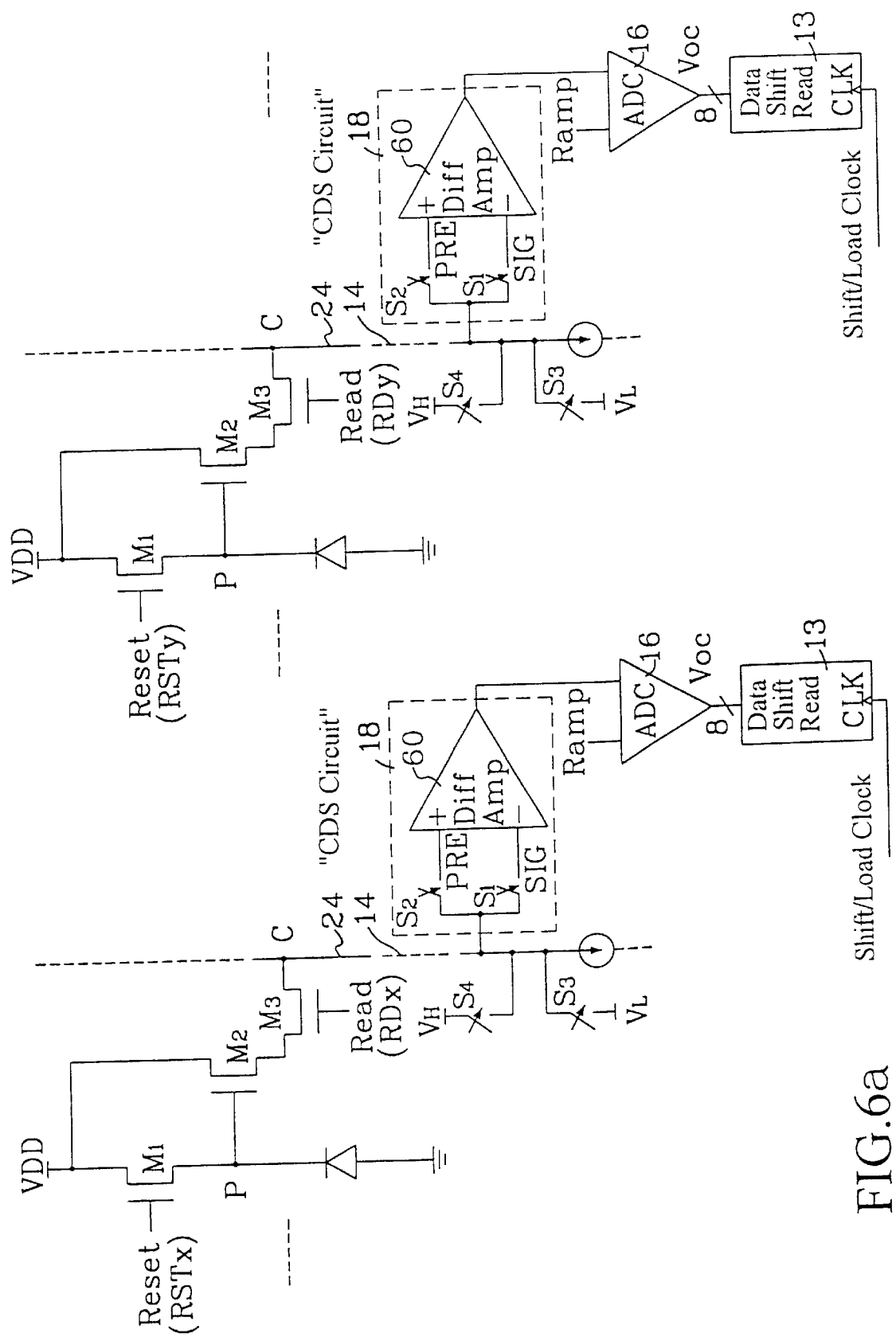
FIG. 6(a) is a simplified schematics of one preferred embodiment reducing the distortion of parasitic effects.
Figure 7A:
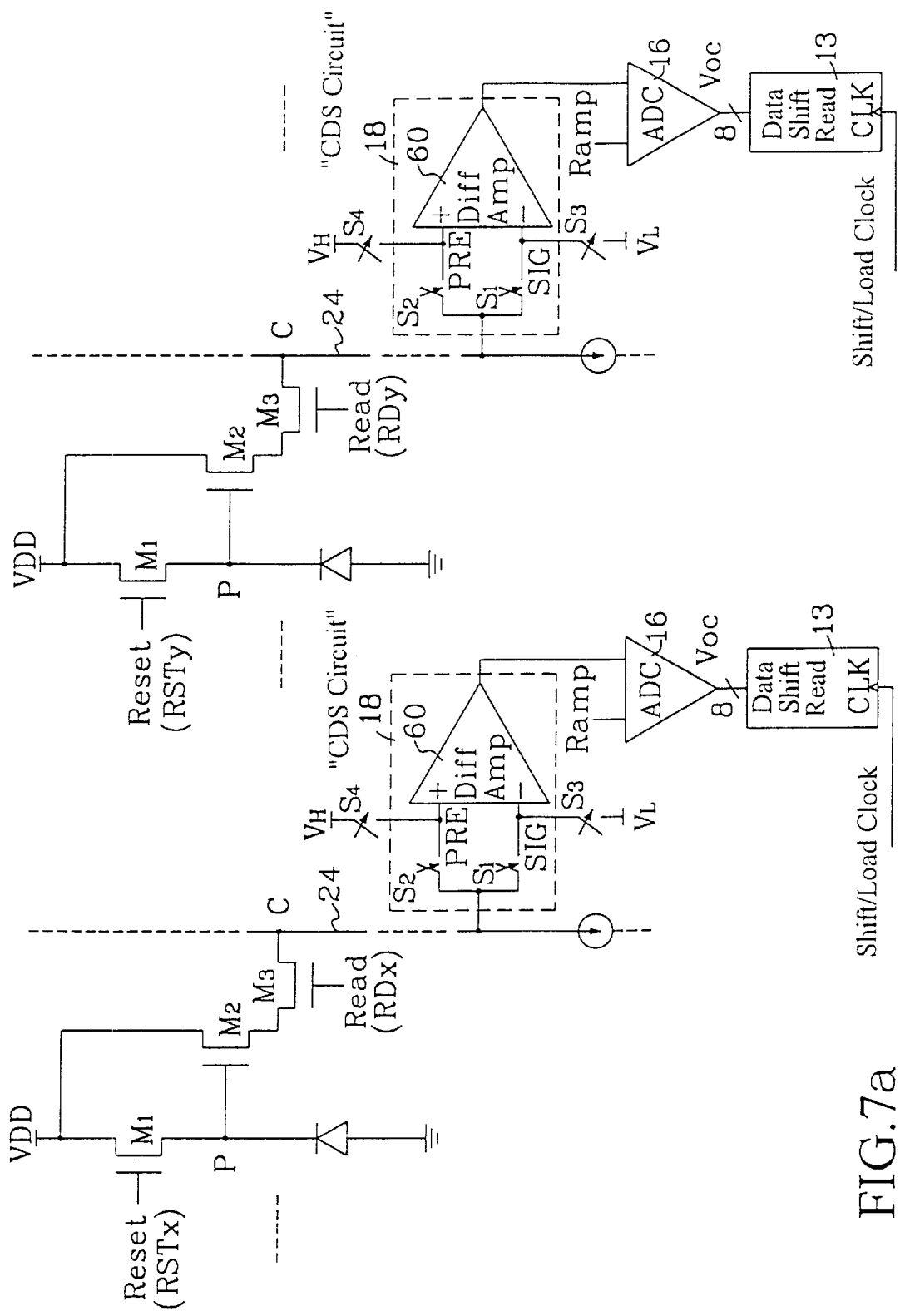
FIG. 7(a) is a simplified schematics of another preferred embodiment reducing the distortion of parasitic effects.
Figure 7B:
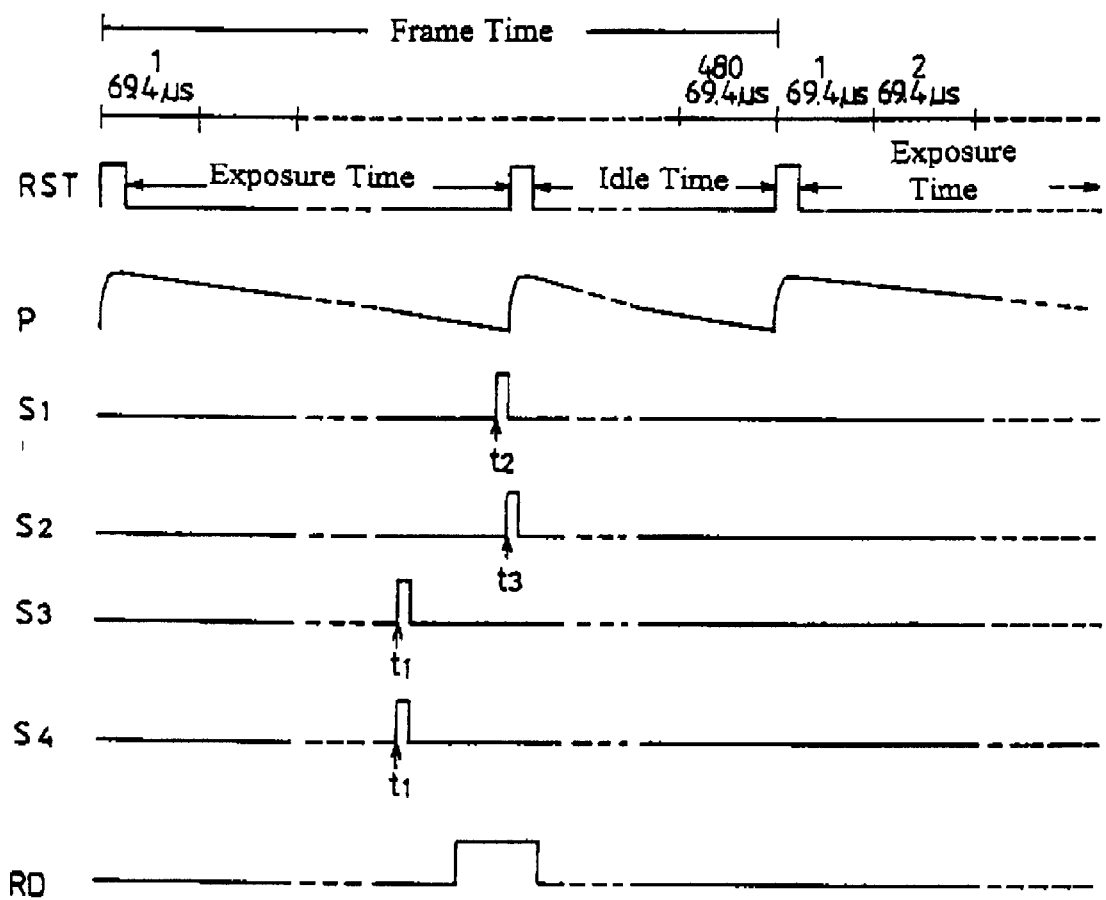
FIG. 7(b) is the operational timing diagrams in FIG. 7(a).

FIG. 7(a) shows an alternative for the generation of Vref (=VH−VL) voltage at the output of the CDS circuit 18 as compared to that of FIG. 6(a). The objective is achieved by presetting the input nodes (SIG) and (PRE) of the differential amplifier 60 to VL and VH levels, respectively, by turning on the switch S3 and S4t time $t_1$ shown in FIG. 7(b). As expected, the output of CDS circuit 18 would then be Vref (=VH−VL), assuming the offset voltage for each CDS is negligible. In FIG. 7(b), the occurrence of the pulses at time t2 and t3 on signals S1, S2 involves the sampling of the actual image signal.

Figure 8A:
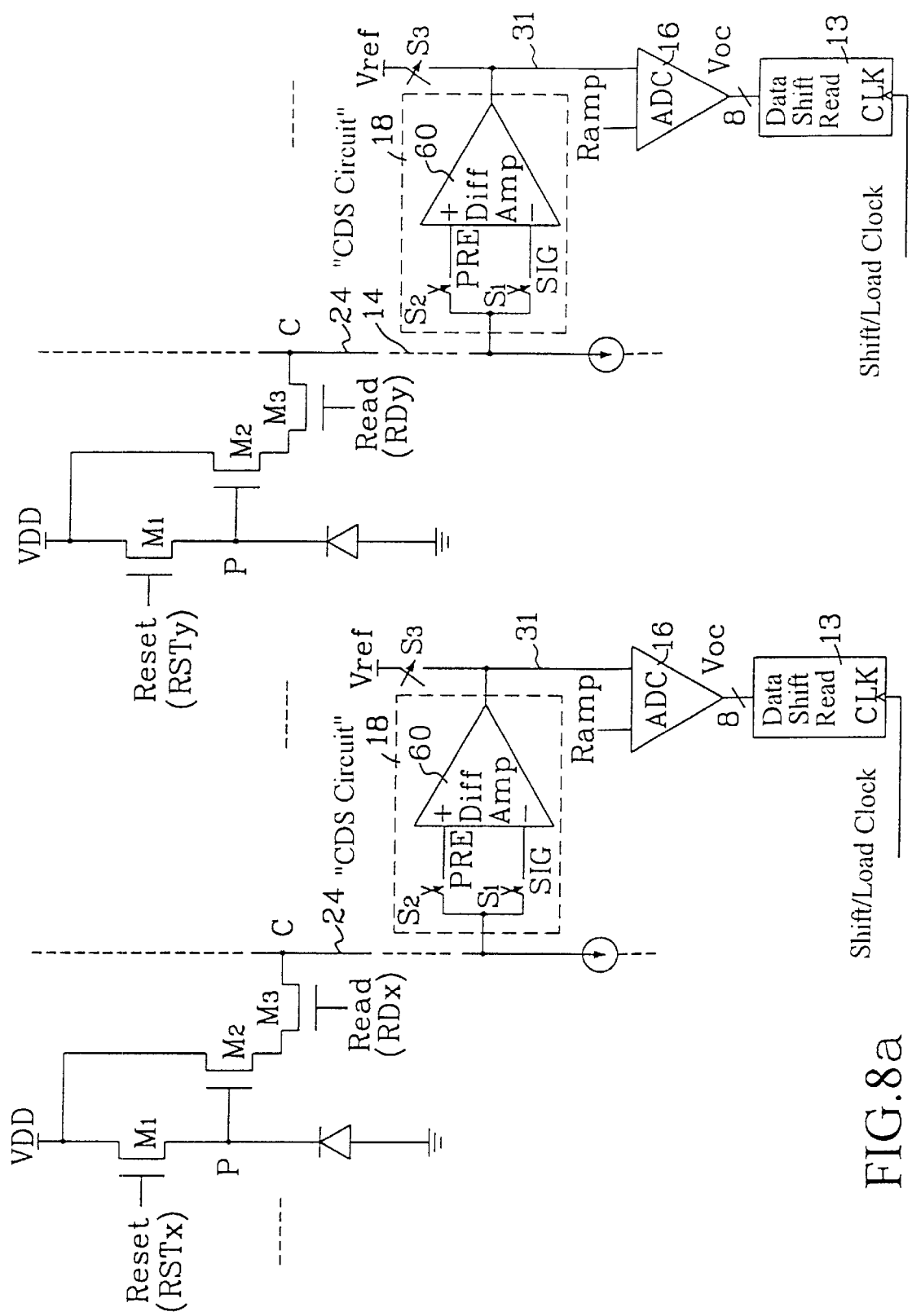
FIG. 8(a) is a schematics of another preferred embodiment reducing the distortion of parasitic effects.
Figure 8B:
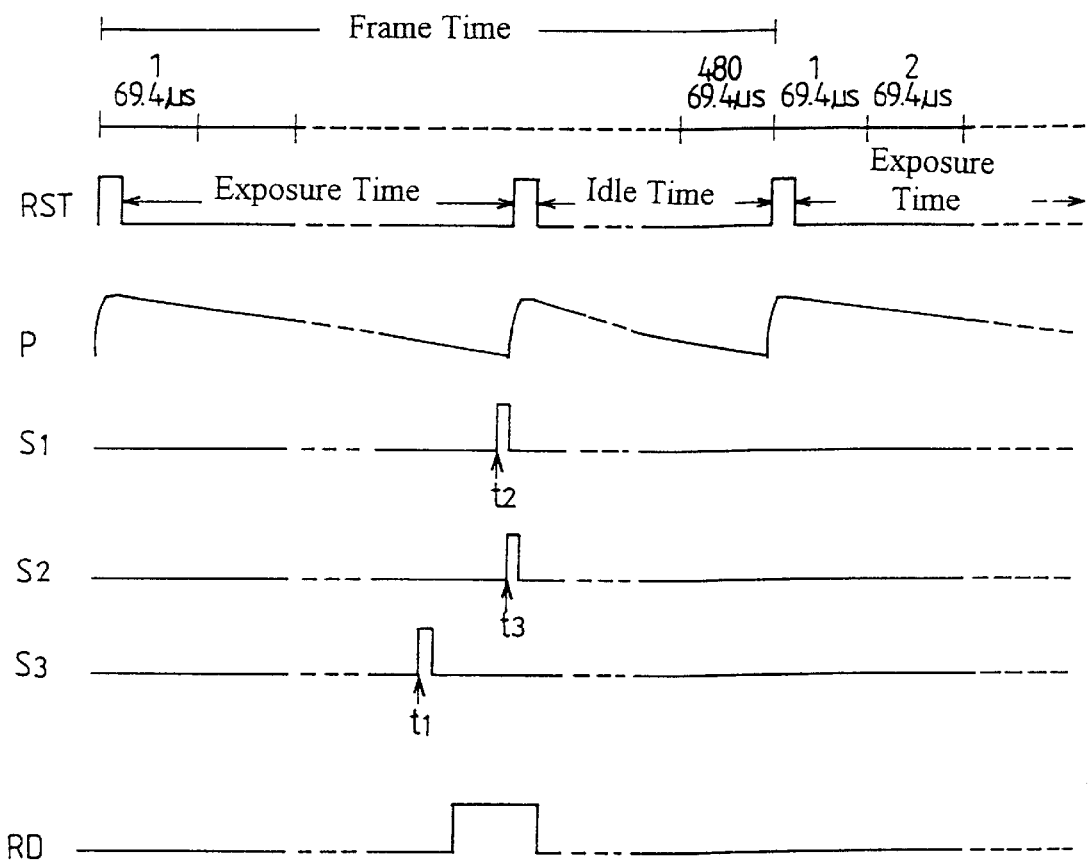
FIG. 8(b) is the timing diagram of read operation corresponding to FIG. 8(b).
Figure 9:
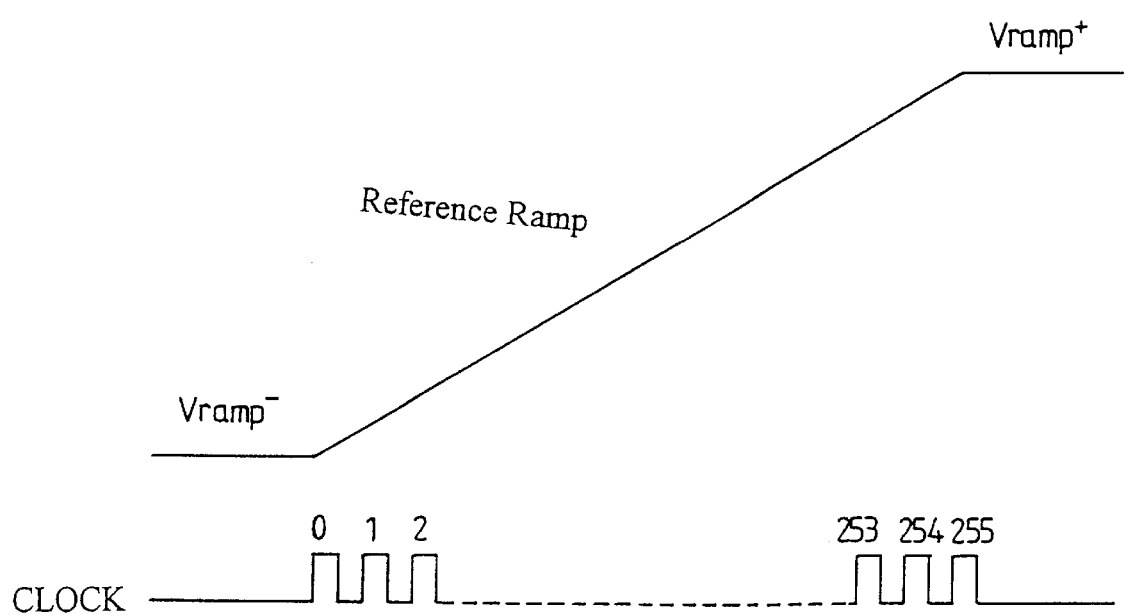
FIG. 9 shows an 8-bit ADC reference ramp timing diagram.

Furthermore, in the case where the non-uniformity among columns caused by the CDS circuits is negligible and not to be concerned, the compensation can be made only to the portion caused by the ADC circuits between columns. In this case, the generation of Vref (=VH−VL) voltage as a pseudo image signal to the input of ADC on each column can be done by presetting the input node of ADC to Vref by turning on switch S3 in FIG. 8(a) at the time t1 shown in. FIG. 8(b). The occurrence of the pulses at time t2 and t3 on signals S1, S2 in FIG. 8(b) involve the sampling of the actual image signal.

Figure 6B:
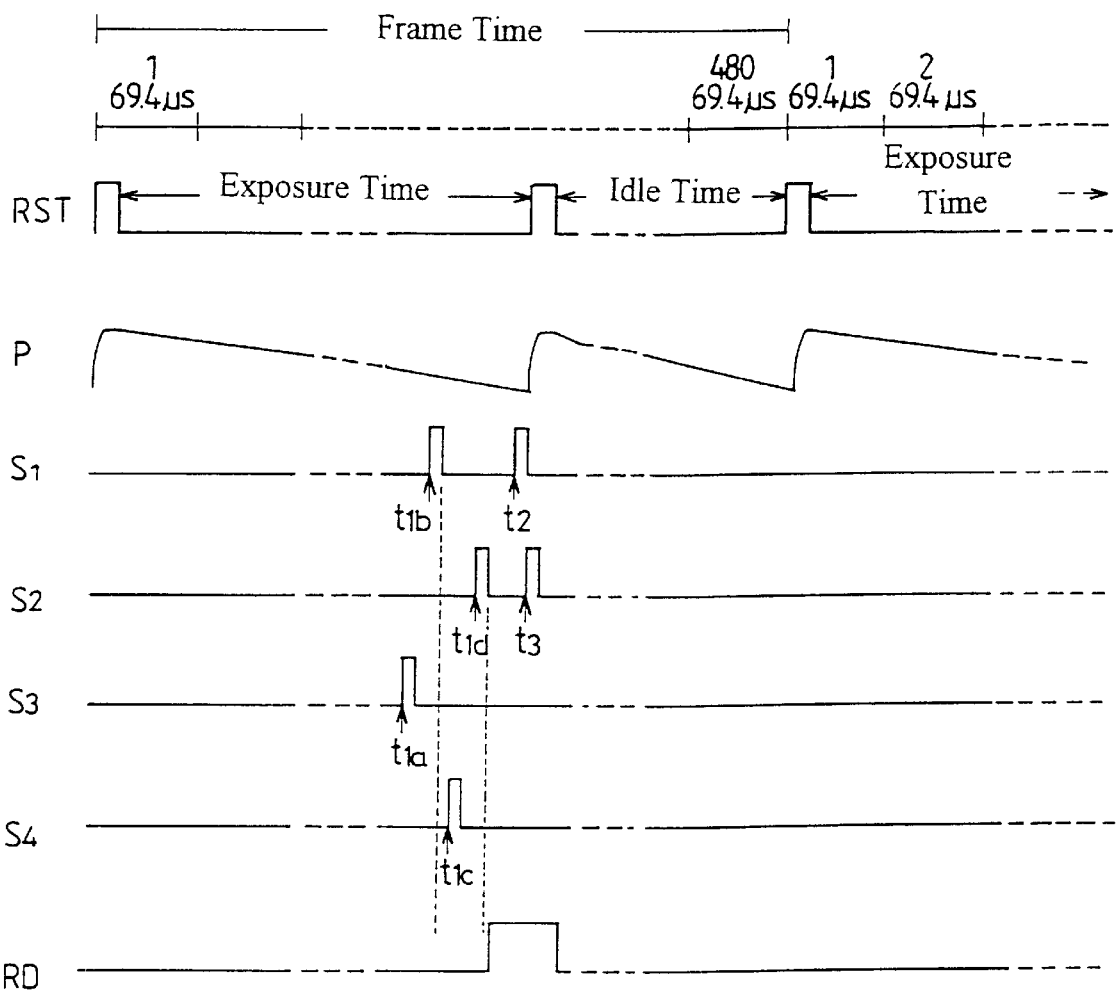
FIG. 6(b) is the operational timings in FIG. 6(a).

By adopting either one of three methodologies described above, the voltage at the output of CDS circuit 18 would then be converted to a digital value by ADS circuit 16 at time period after $t_{1d}$ and before $t_2$ shown in FIG. 6(b), or after $t_1$ and before $t_2$ in FIG. 7(b) and FIG. 8(b). If the offset voltage for each comparator of ADC circuit as well as CDS circuit for each column within array deviates from that of others, it will be expected that the digital value output from ADC circuit would be different among columns under the same Vref signal.

By the present invention, the binary complement to the digital value obtained for one ADC circuit during an initialization period is used to initialize the counter within the corresponding ADC 16 before the actual image value conversion for each row line within a frame time slot is performed. That is, each initial values of ADC's counters with respect to respective columns are used to minimize the offset caused by ADC and CDS circuits between columns. The invention may be further realized by the following elaboration of an exemplary operation results.

In the following, as an example, one may choose 0.5 volts as the maximum allowable output voltage shift Vsh in either direction. However, it is likely the value of Vsh in the positive direction is different from value of Vsh in the negative direction under actual conditions. In addition, one may select the voltage difference of Vramp+ and Vramp− value of the ramp signal to be 3.5 volts while the analog signal 31 input to the comparator 32 falls within the range between Vramp+ and Vramp−. By a statistical approach, all image sensor chips having device characters deviating from the above range, ±0.5 volts, can be screened out. By appropriate choice of fabrication process and the exposure time interval, one may design the range of signal of ΔVc running from 0.5 volts to 3 volts with Vsh=0.5 volts in either directions. In this way, the final output value will not be above 3.5 volts or below 0 volts. ΔVc=3 volts corresponds to full scale of light intensity while ΔVc=0.5 volts corresponds to darkness. As an example, during image sense period, after actions of the corresponding switches at t2, t3 respectively, the maximum difference signal input to the CDS circuit may be 3 volts and therefore outputs an analog signal of substantial 3.5 volts. On the other hand, the minimum-difference signal input to the CDS circuit may be 0.5 volts and therefore outputs an analog signal of substantial 0 volts. Therefore, the dynamic range of output of the A/D converter 16 goes from 0 volts to 3.5 volts taking into account of Vsh.

Without the provision of the present invention and for ΔVc=3 volts with Vsh being ±0.5 volts, the 8-bit A/D converter 16 correspondingly outputs $Voc_n$, Voc+, Voc__ having values as shown below. This phenomenon is the non-uniformity among columns the inventor intends to solve.

$Voc_+$=11111111=255(decimal) . . . corresponding to 3.5 volts  (1)

$Voc_n$=11011010=218(decimal) . . . corresponding to 3 volts  (2)

$Voc__$=10110110=182(decimal) . . . corresponding to 2.5 volts  (3)

Before the actual analog signal conversion for image signal, the present invention provides an initialization period during which an autocalibration of the counter within the A/D converter is performed to offset all non-uniformity among different pixel columns within the array. For each image frame time, the intialization of the counter is performed once before the read operation of the first row of the frame by presetting the input of CDS 18 or A/D converter 16 of each column line to a reference voltage Vref.

As an example, one may employ Vref=(Vramp+)−(Vramp−)−Vsh=3.5 volts−0.5 volts=3 volts during initialization. An A/D convert operation is then performed to generate the corresponding digital output data for each column. Suppose the result of A/D conversion operation for three column lines X, Y, and Z respectively are those shown in items (4), (5), and (6). The present invention uses the data in items (4), (5), and (6) to obtain the required offset values by inverting the binary data of (4), (5), and (6) to their binary complement, respectively, as listed below in items (7), (8), and (9).

$Voc_+$=11111111=255(decimal) . . . corresponding to 3.5 volts  (4)

$Voc_n$=11011010=218(decimal) . . . corresponding to 3 volts  (5)

$Voc__$=10110110=182(decimal) . . . corresponding to 2.5 volts  (6)

Column X: 00000000=0(decimal)  (7)

Column Y: 00100101=37(decimal)  (8)

Column Z: 01001001=73(decimal)  (9)

Figure 10:
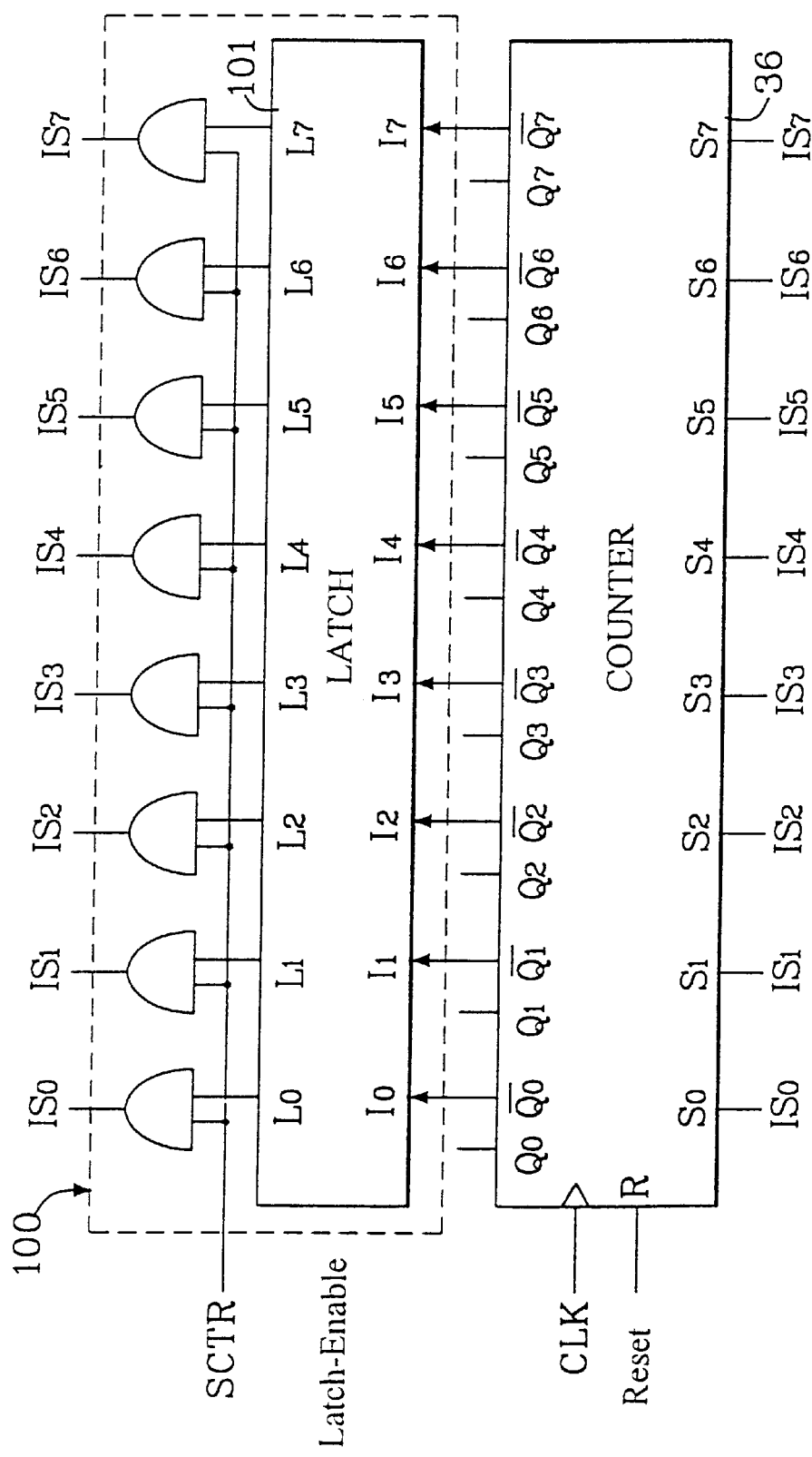
FIG. 10 shows how an initialization circuit, as an example, is implemented to initialize the counter in accordance with the preferred embodiment.

The above binary complementary data are respectively used to initialize the respective counter within each ADC circuit 16 corresponding to column lines X, Y and Z. In other words, by the present invention, after the initialization period and before the A/D conversion for actual image signal is performed row by row, the initial value of the counter within each ADC circuit 16 corresponding to columns line f line Y, line Z is 0, 37 and 73 respectively. As a preferred embodiment, an initialization circuit shown in FIG. 10 is connected to the counter within the A/D converter and the output of the initialization circuit is used to initialize the counter within the A/D converter according to the invention during the initialization period. In FIG. 10, the latch-enable signal is used to latch the output signal from counter into the latch of the initialization circuit. The SCTR signal enables the output (IS0, IS1 . . . IS7) from the latch to preload the counter as recited above.

Due to the values of counters within ADC circuits 16 for each column line before actual image capture are respectively initialized according to the method described above, non-uniformity caused by the parasitic effects of each A/D converter are minimized.

For instance, as ΔVc signals, during sampling of actual image signal, for the column line X, line Y, line Z mentioned above are equal to 3 volts respectively, the resulting A/D output for column line X will be 0+255, i.e. 255, by the invention. Similarly, the resulting A/D output for column line Y will be 37+218, i.e. 255, by the invention. Similarly, the resulting A/D output for column line Z will be 73+182, i.e. 255, by the invention. In other words, during sampling of actual image signal, for ΔVc=3 volts, the respective A/D output for the column line X, line Y, line Z without the invention will be those shown in-list items (1), (2).and (3). On the contrast, with the implementation of the invention, the respective A/D outputs for the column line X, line Y, line Z are all equal to 255 and the uniformity of all columns is achieved as expected.

Similarly, without the provision of the present invention, and, for ΔVc=0.5 volts with Vsh being ±0.5 volts, we assume the 8-bit A/D converter correspondingly outputs $Voc_n$, Voc+, Voc__ having values as shown below.

$Voc_+$=01001001=73(decimal) . . . corresponding to 1 volts (10)

$Voc_n$=00100100=36(decimal) . . . corresponding to 0.5 volts (11)

$Voc_-$=00000000=0(decimal) . . . corresponding to 0 volts (12)

With the present invention, as ΔVc signals, during sampling of actual image signal, for column line X, line Y, line Z mentioned above are equal to 0.5 volts respectively, the resulting A/D output for column line X will be 0+73, i.e. 73, by the invention. Similarly, the resulting A/D output for column line Y will be 37+36, i.e. 73, by the invention. Similarly, the resulting A/D output for column line Z will be 73+0, i.e. 73, by the invention. In other words, during sampling of actual image, signal, for ΔVc=0.5 volts, the respective A/D output, without the invention, will be those shown in list items (10), (11) and (12). On the contrast, with the implementation of the invention, the respective A/D outputs are all equal to 73 and the uniformity of all columns is achieved as expected.

In case a higher resolution is required in actual practice, the bits of ADC counter can increase beyond 8 bits to meet requirement. Types of ADCs other than that shown in FIG. 3 are available and may be used but still achieve the objective of the invention without departing from the spirit of the invention.

Although the recitation of the invention is made with the application to a CMOS type image sensor chip, it is important to note that the invention is applicable also to any circuits which employing A/D converter array and require output uniformity across the converters in the array.

While the preferred embodiment of the invention has been described and illustrated, it will be obvious to those skilled in the art that various equivalent modifications can be made without departing from the spirit and scope of the invention which is defined by the following claims.

For instance, instead of employing the exemplary circuit in FIG. 10 to initialize the counter with ADC as recited above, one may obtain the initialization value by complementing the output of each ADC during thee initialization period for each frame. The initialization values obtained then are stored in a data latch circuit. During actual image capturing operation, these values then are respectively added to each output of the ADC by an additional adder circuit to offset the non-uniformity among the columns.

Wheat is claimed is:

1. A signal sensing apparatus comprising:
a signal sensing array having N columns of output lines for outputting N analog signals, respectively, N being an integer greater than one;
a signal processing means for generating N digital signals each of which corresponds to one of N analog signals, respectively, the signal processing means having N input lines comprising:
N A/D converters each including a counter for generating one of the N digital signals, respectively, wherein during an initialization period prior to the N digital signals being produced, a predetermined reference voltage is coupled to inputs of the N A/D converters and a compensation value corresponding to each of the N A/D converters is obtained, wherein the compensation value is a binary complement to the digital signal from a corresponding A/D converter as the reference voltage is applied during the initialization period, so that the counter within each of the N A/D converter is initialized with the compensation value to compensate for the digital output of the corresponding A/D converter, thereby balancing non-uniformity of elements within the signal processing means.

2. The signal sensing apparatus of claim 1, wherein the signal processing means further comprises N initialization circuits each of which loads the compensation value into the corresponding counter to compensate for the digital output of the corresponding counter.

3. The signal sensing apparatus of claim 1, wherein the signal processing means further comprises N initialization circuits each of which latches and adds the compensation value to the output of the corresponding counter to compensate for the digital output of the corresponding counter.

4. The signal sensing apparatus of claim 1, wherein the signal processing means further comprises:
N sampling circuits connected to the N input lines of the signal processing means, each of which generates a sampled analog signal in response to a corresponding one of the N analog signals.

5. The signal sensing apparatus of claim 4, wherein each of the N A/D converters has a first input terminal for receiving a reference ramp signal, and a second input terminal for receiving the sampled analog signal.

6. The signal sensing apparatus of claim 4, wherein each of the N sampling circuits comprises a first input terminal and a second input terminal and, during the initialization period, the predetermined reference voltage is applied across the first and second input terminals such that the compensation value corresponding to each of the N A/D converters is obtained at the output of the A/D converter.

7. The signal sensing apparatus of claim 4, wherein during the initialization period, the predetermined reference voltage is applied to the output of each of the N sampling circuits such that the compensation value corresponding to each set of A/D converters is obtained at the output of the A/D converter.

8. The signal sensing apparatus of claim 1, wherein the signal sensing array is an image sensing array.

9. The signal sensing apparatus of claim 5, wherein the reference voltage is equal to (Vramp+)−(Vramp−)−Vsh, wherein Vsh is greater than or at least equal to an offset voltage caused by the A/D converter, Vramp+ is the highest value of the reference ramp signal, and Vramp− is the lowest value of the reference ramp signal.

10. The signal sensing apparatus of claim 8, wherein the signal sensing apparatus is a CMOS type image sensor.

11. The signal sensing apparatus of claim 10, wherein the CMOS type image sensor is a monolithic CMOS type image sensor.

12. A method for initializing a signal sensing apparatus comprising a signal sensing array having N columns of output line for outputting N analog signals, respectively, and a signal processing means having N input lines and N A/D converters for generating N digital signals, each of which corresponds to one of N analog signals, respectively, N being an integer greater than one, the method comprising the steps of:
(a) during an initialization period prior to generating the N analog signals, coupling a predetermined reference voltage to the outputs of the N A/D converters of the signal processing means such that a compensation value corresponding to each set of A/D converters is obtained at the output of each of the N A/D converters, wherein the compensation value is a binary complement to the digital signal from the corresponding A/D converter as the reference voltage is applied; and
(b) prior to generating the N analog signals, initializing a counter within each of the N A/D converters with the corresponding compensation value to compensate for the digital output of the corresponding A/D converter, thereby balancing non-uniformity of elements within the signal processing means.

13. The method of claim 12, step (b) further comprising the step of loading the compensation value into one corresponding counter to compensate for the digital signal output from the counter by means of N sampling circuits.

14. The method of claim 12, step (b) further comprising the step of latching and adding the compensation value to the output of the corresponding counter by means of N sets of sampling circuits.

15. The method of claim 12, prior to step (a) further comprising the step of sampling each of the N analog signals by means of N sampling circuits to generate a sampled analog signal corresponding, thereto, respectively.

16. The method of claim 15, further comprising the step of providing each of the N A/D converters with a first input terminal for receiving a reference ramp signal and a second input terminal for receiving the sampled analog signal.

17. The method of claim 15, step (b) further comprising the step of applying the predetermined reference voltage across a first and second input terminals of each of the N sampling circuits during, the initialization period such that the compensation value corresponding to each set of A/D converters is obtained at the output of the A/D converter.

18. The method of claim 15, step (b) further comprising the step of applying the predetermined reference voltage across the output of each of the sampling circuits during the initialization period such that the compensation value corresponding to each of the N A/D converters is obtained at the output of the A/D converter.

19. The method of claim 12, further comprising the step of providing the signal sensing array with an image sensing array.

20. The method of claim 16, further comprising the step of providing the reference voltage with (Vramp+)−(Vramp−)−Vsh, wherein Vsh is greater than or at least equal to an offset voltage caused by the A/D converter, Vramp+ is the highest value of the reference ramp signal, Vramp− is the lowest value of the reference ramp signal.

21. The method of claim 19, further comprising the step of providing the signal sensing apparatus with a CMOS type image sensor.

22. The method of claim 21, further comprising the step of providing the CMOS type image sensor with a monolithic CMOS type image sensor.

23. A signal processing means for use in a signal sensor apparatus comprising a signal sensing means having N columns of output lines for outputting N analog signals, respectively, the signal processing means having N input lines for generating N digital signals each of which corresponds to one of the N analog signals, respectively, N being, an integer greater than one wherein the signal processing means comprises:
N A/D converters each of which includes a counter for generating one of the N digital signals, respectively, wherein, during an initialization period prior to the N digital signals being produced, a predetermined reference voltage is coupled to inputs of the N A/D converters and a compensation value corresponding to each of the N A/D converters is obtained, wherein the compensation value is a binary complement to the digital signal from the corresponding A/D converter as the reference voltage is applied during the initialization period, so that the counter within each of the N A/D converters is initialized with the compensation value to compensate for the digital output of the corresponding A/D converter, thereby balancing non-uniformity of elements within the signal processing means.

24. The signal processing means of claim 23, further comprising N initialization circuits each of which loads the compensation value into the corresponding counter to compensate for the digital output of the corresponding counter.

25. The signal processing means of claim 23, further comprising N initialization circuits each of which latches and adds the compensation value to the output of the corresponding counter to compensate for the digital output of the corresponding counter.

26. The signal processing means of claim 23, further comprising N sampling circuits each of which generates a sampled analog signal in response to a corresponding one of the N analog signals.

27. The signal processing means of claim 26, wherein each of the N A/D converters has a first input terminal for receiving a reference ramp signal, and a second input terminal for receiving the sampled analog signal.

28. The signal processing means of claim 26, wherein each of the N sampling circuits comprises a first input terminal and a second input terminal and, during the initialization period, the predetermined reference voltage is applied across the first and second input terminals such that the compensation value corresponding to each of the N A/D converters is obtained at the output of the A/D converter.

29. The signal processing means of claim 26, wherein during the initialization period, the predetermined reference voltage is applied to the output of each of the N sampling circuits such that the compensation value corresponding to each set of A/D converters is obtained at the output of the A/D converter.

30. The signal processing means of claim 23, wherein the signal sensing means is an image sensing array.

31. The signal processing means of claim 27, wherein the reference voltage is equal to (Vramp+)−(Vramp−)−Vsh, wherein Vsh is greater than or at least equal to an offset voltage caused by the A/D converter, Vramp+ is the highest value of the reference ramp signal, Vramp− is the lowest value of the reference ramp signal.

32. In a signal sensing apparatus comprising a signal sensor means having N columns of output lines for outputting N analog signals, respectively, and a signal processing means having N input lines and comprising N A/D converters for generating N digital signals each of which corresponds to one of the N analog signals, respectively, N being an integer greater than one, a method for initializing a counter within a corresponding one of the N A/D converters within the signal processing means in order to minimize non-uniformity of the elements within the signal processing means, the method comprising the steps of:

(i) during an initialization period prior to generating the N analog signals, coupling a predetermined reference voltage to the outputs of the N A/D converters of the signal processing means such that a compensation value corresponding to each of the N A/D converters is obtained at the output of each set of A/D converters, wherein the compensation value is a binary complement to the digital signal from the corresponding A/D converter as the reference voltage is applied; and (ii) prior to generating the N analog signals, initializing the counter within each of the N A/D converters with the corresponding compensation value to compensate for the digital output of the corresponding A/D converter, thereby balancing non-uniformity of elements within the signal processing means.

33. The method of claim 32, step (ii) further comprising the step of loading the compensation value into one corresponding counter to compensate for the digital signal output from the counter by means of N initialization circuits.

34. The method of claim 32, step (ii) further comprising the step of latching and adding the compensation value to the output of the corresponding counter by means of N initialization circuits.

35. The method of claim 32, prior to step (i) further comprising the step of sampling each of the N analog signals by means of N sampling circuits to generate a sampled analog signal corresponding thereto, respectively.

36. The method of claim 35, further comprising the step of providing each of the N A/D converters with a first input terminal for receiving a reference ramp signal, and a second input terminal for receiving the sampled analog signal.

37. The method of claim 35, step (ii) further comprising the step of applying the predetermined reference voltage across the first and second input terminals of each of the sampling circuits during the initialization period such that the compensation value corresponding to each of the N A/D converters is obtained at the output of the A/D converter.

38. The method of claim 35, step (ii) further comprising the step of applying the predetermined reference voltage across the output of each of the sampling circuits during the initialization period such that the compensation value corresponding to each of the N A/D converters is obtained at the output of the A/D converter.

39. The method of claim 32, further comprising the step of providing the signal sensing means with an image sensing array.

40. The method of claim 36, further comprising the step of providing the reference voltage with (Vramp+)−(Vramp−)−Vsh, wherein Vsh is greater than or at least equal to an offset voltage caused by the A/D converter, Vramp+ is the highest value of the reference ramp signal, Vramp− is the lowest value of the reference ramp signal.

* * * * *